United States Patent
Chung

(10) Patent No.: US 7,369,425 B2
(45) Date of Patent: May 6, 2008

(54) METHOD AND SYSTEM FOR DRAM SENSING

(75) Inventor: Shine Chung, Taipei Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/517,674

(22) Filed: Sep. 8, 2006

(65) Prior Publication Data

US 2008/0062795 A1    Mar. 13, 2008

(51) Int. Cl.
*G11C 11/24* (2006.01)

(52) U.S. Cl. .................. 365/149; 365/203; 365/205

(58) Field of Classification Search .............. 365/149, 365/203, 205
See application file for complete search history.

(56) References Cited

U.S. PATENT DOCUMENTS 5,255,232 A * 10/1993 Foss et al. ............... 365/203
6,226,205 B1 * 5/2001 Guritz .................. 365/189.09

OTHER PUBLICATIONS

Barth, John, et al., "A 300MHz Multi-Banked eDRAM Macro Featuring GND Sense, Bit-Line Twisting and Direct Reference Cell Write", ISSCC 2002, Session 9, DRAM and Ferroelectric Memories, 9.3 (2002).

\* cited by examiner

*Primary Examiner*—David Lam
(74) *Attorney, Agent, or Firm*—Kirkpatrick & Lockhart Preston Gates Ellis LLP

(57) ABSTRACT

This invention discloses a dynamic random access memory (DRAM) device comprising a first bit-line coupled to a first terminal of at least one memory cell capacitor through one or more pass transistors, a second bit-line coupled to a first terminal of at least one reference cell capacitor through one or more pass transistors, and a cell plate connected to both a second terminal of at least one memory cell capacitor and a second terminal of at least one reference cell capacitor, wherein the cell plate is biased at approximately one half of a voltage difference between a positive supply voltage (Vdd) and a complementary lower supply voltage (Vss), and wherein the reference cell capacitor does not store any charge prior to a reading operation, and wherein both the first and second bit-lines are pre-charged to either Vdd or Vss prior to the reading operation.

17 Claims, 5 Drawing Sheets

METHOD AND SYSTEM FOR DRAM SENSING

BACKGROUND

The present invention relates generally to dynamic random access memories (DRAMs), and, more particularly, to a DRAM that is capable to operate at low supply voltage.

There are two forces that are currently drive power supply voltage on an integrated circuit (IC) chip to ever lower. One of the forces is a desire for portability of electronic equipment that can be operated by batteries. Such equipments include hearing aids, implantable cardiac pacemakers, cell phones, and hand held multimedia terminals. When a power supply voltage drops, the power consumption will drop by a square amount of that voltage.

Another driving force is the ever shrinking process technologies. Smaller geometry and thinner gate oxide of semiconductor devices cannot tolerate traditional 5V or even 3.3V power supply voltage. For instance, in a 0.13 um technology node, the power supply voltage is as low as 1.2V. Some time, even the external power supply voltage is 2.5V, which will have to be converted to 1.2V for internal circuits to properly operate. This is certainly the case for a state of the art DRAM chip.

A simplest DRAM cell comprises a single transistor and a single capacitor. If charges are stored in the capacitor, the cell is said to store a logic '1', depending on the convention used. Then if no charges are present, the cell is said to store a logic '0'. Since the charges in the capacitor dissipates over time, DRAM systems require additional refreshing circuitries to periodically refresh the charges stored in the capacitors. But a capacitor can store only a very limited amount of charges, to fast distinguish the difference between a logic '1' and a logic '0', two bit lines are typically used for each bit with the first in the bit line pair known as a bit line true (BLT) and the other being the bit line complement (BLC). A sense amplifier compares BLT and BLC and outputs either a high or a low voltage to represent a logic value stored in the bit.

In order to gain speed and reliability, a half-Vdd (i.e., Vdd/2, where Vdd stands for a positive supply voltage) sensing scheme is commonly used, in which the bit-lines are pre-charged to a voltage of Vdd/2 prior to reading. When a particular cell is selected, the charges stored on the memory cell capacitor will be shared with the corresponding bit-line thus causing the voltage on the corresponding bit-line to rise above or fall below Vdd/2. While the complementary bit-line has no charge sharing, and hence stays at Vdd/2. A voltage difference between the bit-line pair is then sensed and amplified for reading the cell. The same applied to those cells connecting to bit line complements through the pass transistors.

The aforementioned Vdd/2 sensing scheme works very well when Vdd is sufficiently high, such as 3.3V. But its sensing speed and noise margin suffer when Vdd becomes lower. When the Vdd drops to 1.2V, and threshold voltages of N-type metal-oxide-semiconductor (NMOS) and P-type metal-oxide-semiconductor (PMOS) are about 0.3V and −0.3V, respectively. With the Vdd/2 sensing scheme, the headroom for the NMOS and PMOS transistors in the sense amplifier becomes 1.2V/2−0.3V=0.3V, which is very small for any high speed operation. In practice, the DRAM chip is required to be able to operate at Vdd=0.7V. Then the headroom of the sense amplifier is 0.05V, which is too marginal for the DRAM chip to work properly.

As such, what is desired is a DRAM sensing scheme that allows the DRAM chips to operate at a very low power supply voltage.

SUMMARY

This invention discloses a dynamic random access memory (DRAM) device comprising a first bit-line coupled to a first terminal of at least one memory cell capacitor through one or more pass transistors, a second bit-line coupled to a second terminal of at least one reference cell capacitor through one or more pass transistors, and a cell plate connected to both a second terminal of at least one memory cell capacitor and a second terminal of at least one reference cell capacitor, wherein the cell plate is biased at approximately one half of a voltage difference between a positive supply voltage (Vdd) and a complementary lower supply voltage (Vss), and wherein the reference cell capacitor does not store any charges prior to a reading operation, and wherein both the first and second bit-lines are pre-charged to either Vdd or Vss prior to the reading operation.

The construction and method of operation of the invention, however, together with additional objectives and advantages thereof will be best understood from the following description of specific embodiments when read in connection with the accompanying drawings.

DESCRIPTION

The present invention discloses a sensing scheme for dynamic random access memories (DRAM) that pre-charges bit-lines to a full positive supply voltage (Vdd) or to a complementary low supply voltage (Vss or GND which stands for ground), so that the sense amplifier can operate at a very low Vdd, while the cell bottom capacitor plates are still biased at approximately half-Vdd.

Figure 1:
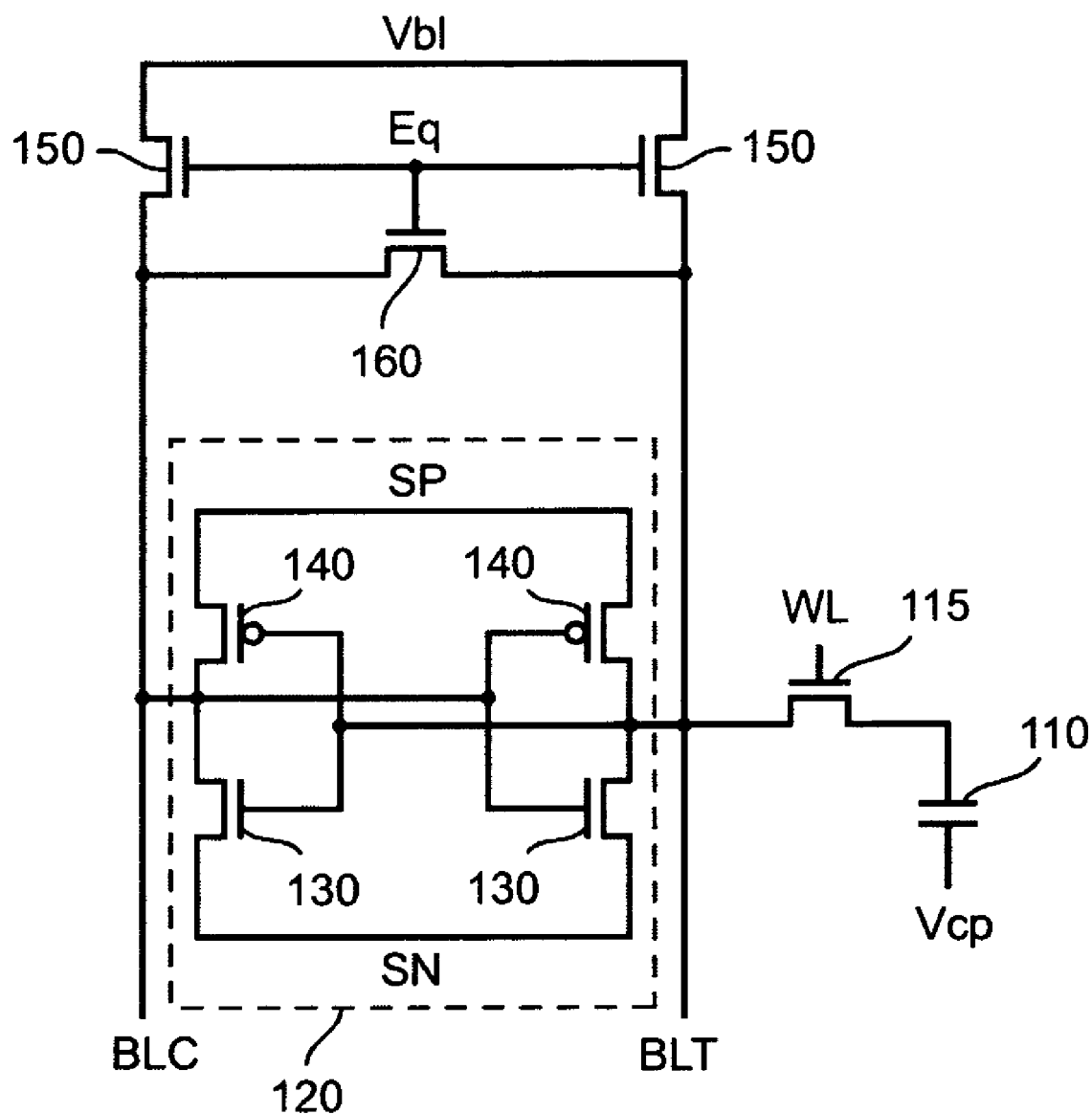
FIG. 1 is a schematic diagram illustrating a conventional DRAM sensing scheme.

FIG. 1 is a schematic diagram illustrating a conventional DRAM sensing scheme. One terminal of a cell capacitor 110 is connected to a cell plate bias Cp, which is also connected to all other cell capacitors in a DRAM cell array. The other terminal of the cell capacitor 110 is coupled to a bit-line (bit-line-true, or BLT) through a pass transistor 115. Before sensing, both bit-lines, BLT and BLC (bit-line complement) are pre-charged to a Vbl voltage. When the bit-lines, BLT and BLC, have a sufficient voltage split, a node SP will be pulled up to Vdd, while a node SN will be pulled down to Vss, to enable sensing and amplifying the bit-line voltage split. In a conventional Vdd/2 sensing scheme, the voltages, Vbl and Vcp, are normally set at about half-Vdd (i.e., Vdd/2) to get equal margins between sensing logic '0' and logic '1'.

The aforementioned conventional Vdd/2 sensing scheme works very well when Vdd is sufficiently high, such as 3.3V. But its sensing speed and noise margin suffers when Vdd becomes lower.

Figure 2A:
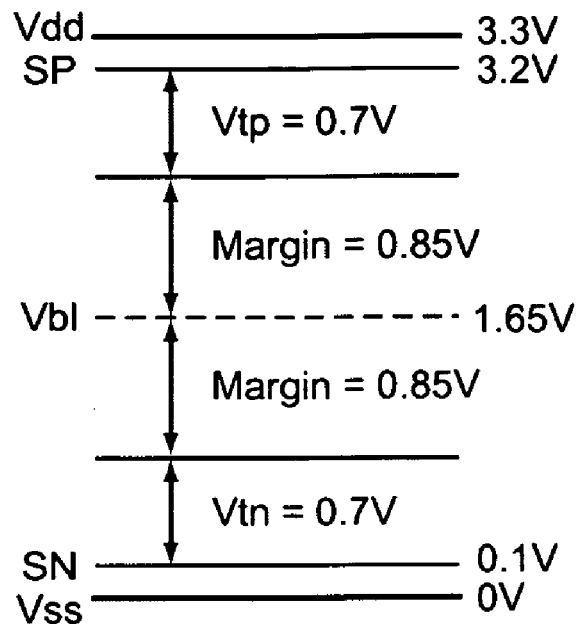
FIGS. 2A and 2B illustrate sensing margins shrinking as Vdd drops.

FIG. 2A illustrates that when Vdd=3.3V, and threshold voltages of both N-type metal-oxide-semiconductors (NMOS) transistor 130 (Vtn) and P-type metal-oxide-semiconductor (PMOS) transistor 140 (Vtp), as shown in FIG. 1, are 0.85V and –0.85V, respectively. Both the NMOS and PMOS transistors have an operation margin of 0.85V, which is sufficient for fast and reliable operations.

Referring to FIG. 2A the SP voltage has not been pulled all the way to the Vdd, and the SN voltage has not been pulled all the way down to the Vss, that is because there must be some kind of gating devices in the paths of both the SP and CP, which causes slight voltage drop.

Figure 2B:
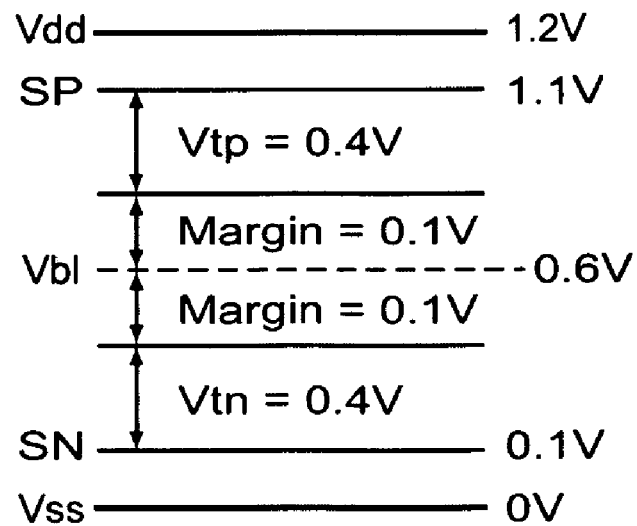

FIG. 2B illustrates a case when Vdd drops to 1.2V, and Vtp=Vtn=0.4V. The SP and SN path resistance still accounts for 0.1V voltage drop. Then the NMOS and the PMOS transistors have only a margin of 0.1V for operating, which is inadequate for a fast and reliable operation.

Figure 3A:
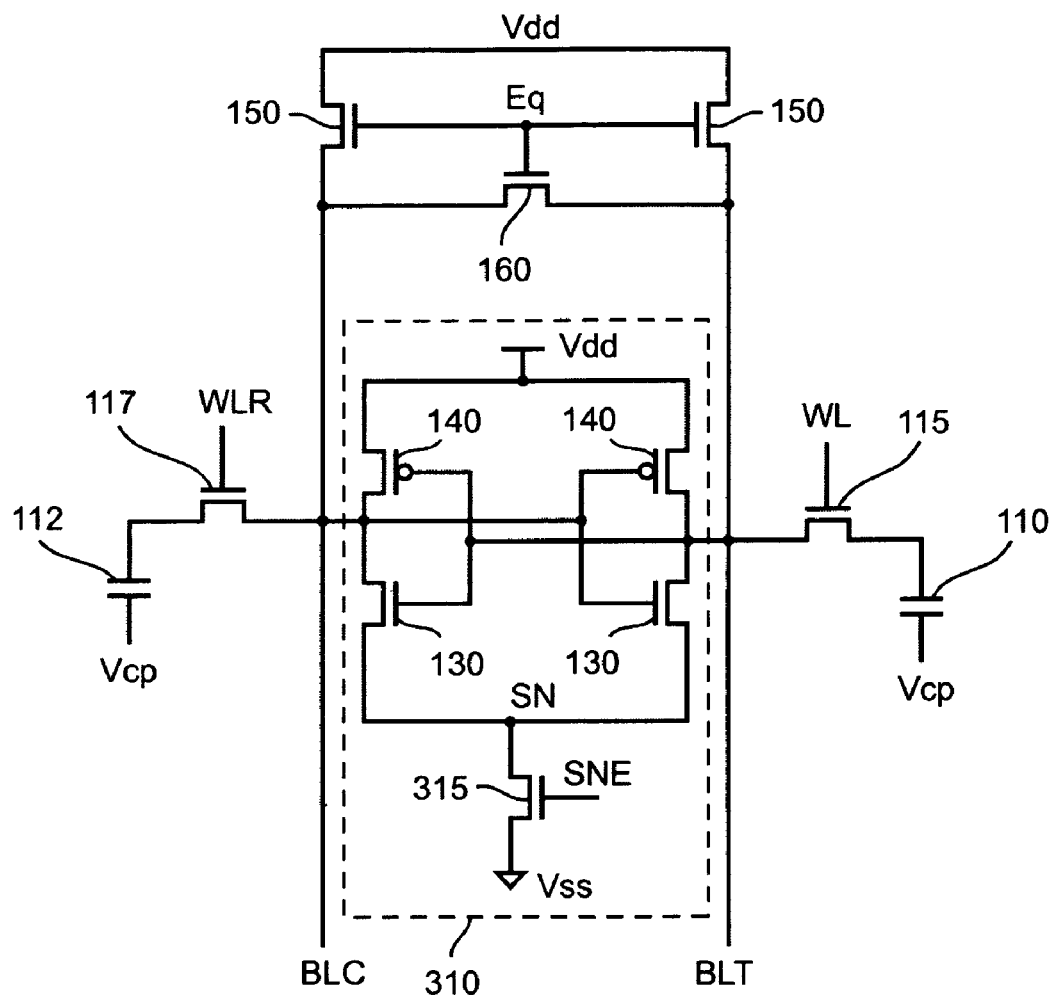
FIG. 3A is a schematic diagram illustrating a DRAM Vdd sensing scheme according to one embodiment of the present invention.

FIG. 3A is a schematic diagram illustrating a DRAM Vdd sensing scheme according to one embodiment of the present invention. Like elements in FIG. 3A and FIG. 1 are labeled with like reference numbers and are therefore not discussed again. The cell capacitor 110 is identical to a reference capacitor 112, with the terminal on the BLT side designated as a positive terminal. The cell plate voltage, Vcp is equal to Vdd/2. When the cell 110 is written a logic '1', i.e., BLT voltage equals Vdd during writing, the cell capacitor 110 stores a +Vdd/2*Cs amount of charges, where Cs is the storage node capacitance. On the other hand when the cell 110 is written a logic '0', i.e., BLT voltage equals Vss during writing, the cell capacitor 110 stores a –Vdd/2*Cs amount of charge. The reference cell 112 stores no charge.

During reading operation, the BLT and BLC are pre-charged to Vdd. When a word-line, WL, and a reference word-line, WLR, turn on the pass transistors 115 and 117, respectively, both the cell and the reference cell capacitors will start sharing charges with the BLT and BLC, respectively. Suppose a DRAM cell has storage capacitance Cs, the bitline capacitance Cb, the differential bit-line voltage Vbl after charge sharing is $$\Delta Vbl=(Vsn-Vbl)/(1+Cb/Cs),$$

where Vsn is the cell storage node voltage, Vdd for storing "1" and 0V for "0", regardless the voltage Vcp.

In the half-Vdd scheme where Vbl=Vdd/2, the differential bitline voltage $\Delta Vbl=0.5*Vdd/(1+Cb/Cs)$ or $-0.5*Vdd/(1\_Cb/Cs)$ for data "1" or "0" after charge sharing. Because of equal sensing margins for "1" and "0", there is no need for reference cell to hang on bitline complement to sense those cells hung on the bitline.

However, in the Vdd sensing scheme, the bitline differential voltage $\Delta Vbl=0$ or $Vdd/(1+Cb/Cs)$ for data "1" and "0", respectively, after Vbl is pre-charged to Vdd and charge sharing at bitline. There is some differential voltage for sensing "0", but no way to sense "1". If there is a reference cell hung on bitline complement and pre-charged to Vdd/2, the differential voltages for bitline and bitline complement will be:

"1"
$\Delta Vbl=0$
$\Delta Vblc=-0.5Vdd/(1+Cb/Cs)$
"0"
$\Delta Vbl=-Vdd/(1+Cb/Cs)$
$\Delta Vblc=-0.5Vdd/(1+Cb/Cs)$ There will be $0.5Vdd/(1+Cb/Cs)$ differential between bit-line and bitline complement for sensing in the Vdd-sensing scheme.

As the voltage difference between the BLT and BLC develops, a sense amplifier 310 will be turned on by a signal SNE, so that the cell state can be read. Note that since the BLT and BLC are pre-charged at Vdd, the sense amplifier 310 is initially biased at full Vdd, which provides the sense amplifier 310 with margins that it can operate as long as Vdd>Vtn Besides, the DRAM cell according to the embodiment of the present invention can operate faster and more reliable than conventional Vdd/2 sensing scheme at a same Vdd level.

Figure 3B:
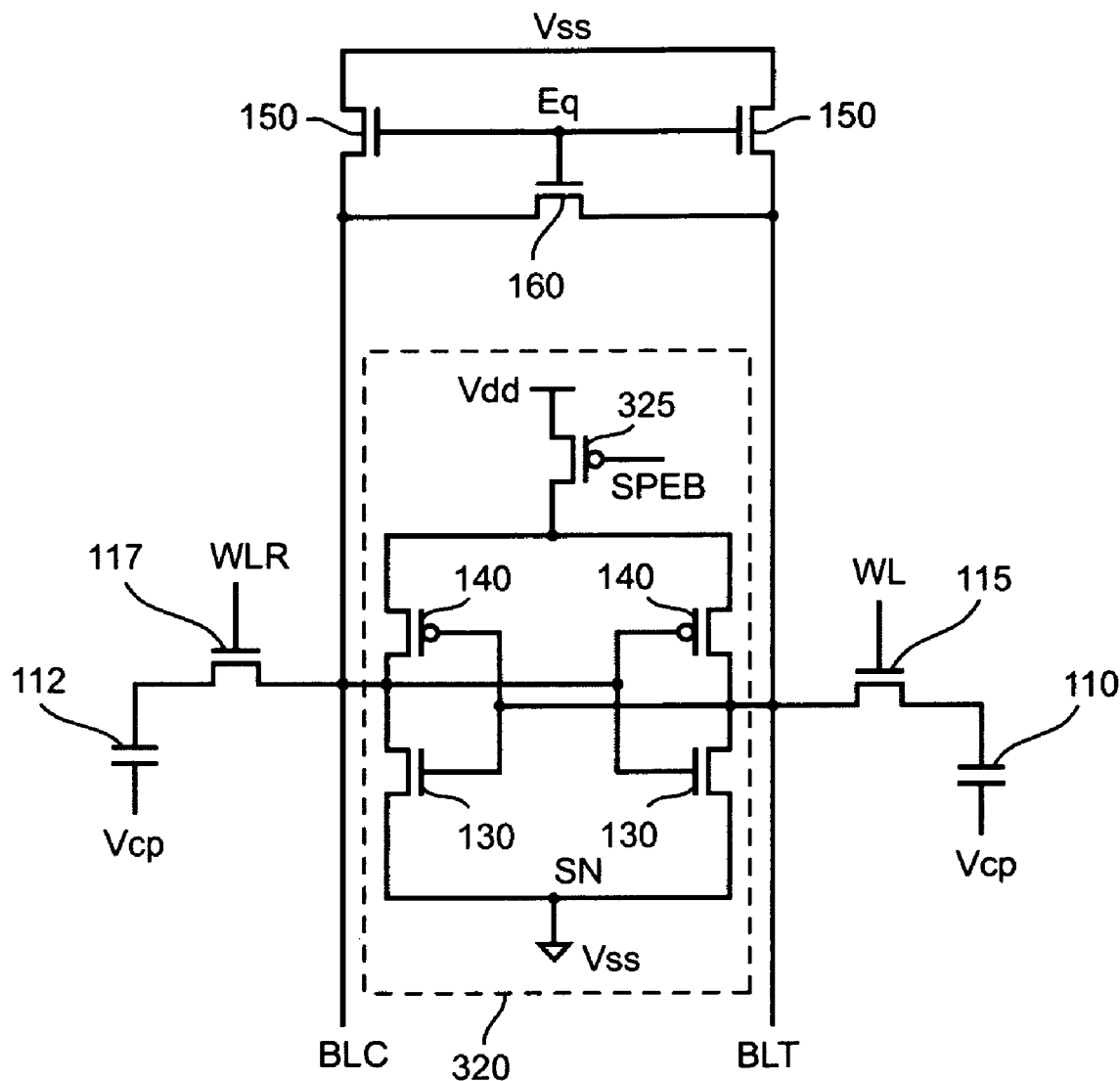
FIG. 3B is a schematic diagram illustrating a DRAM ground sensing scheme according to another embodiment of the present invention.

Similarly, FIG. 3B is a schematic diagram illustrating a DRAM ground sensing scheme according to another embodiment of the present invention. The cells are written in the same way as shown in FIG. 3A, i.e., the cell can store either +Vdd/2*Cs or –Vdd/2*Cs amount of charges. The bitline and bitline complement differential voltages with reference cells after pre-charged to Vss and charge sharing are:

"1"
$\Delta Vbl=Vdd/(1+Cb/Cs)$
$\Delta Vblc=0.5Vdd/(1+Cb/Cs)$
"0"
$\Delta Vbl=0$
$\Delta Vblc=0.5Vdd/(1+Cb/Cs)$ There will be $0.5Vdd/(1+Cb/Cs)$ differential between bit-line and bitline complement for sensing in the Vss-sensing scheme.

As the voltage difference between the BLT and BLC develops, a sense amplifier 320 will be turned on by a signal SPEB, so that the cell state can be read. Note that since the BLT and BLC are pre-charged at Vss, the sense amplifier 320 is also initially biased at full Vdd, which provides the sense amplifier 320 with margins that it can operate with as long as Vdd>|Vtp|.

The effect of ground, sensing scheme shown in FIG. 3B is similar to the effect of Vdd sensing scheme shown in FIG. 3A. One difference is that a PMOS transistor 325 is used for sensing enabling in the sense amplifier 320 in the ground sensing scheme, while a NMOS transistor 315 is used for sensing enabling in the sense amplifier 310 in the Vdd sensing scheme. Since NMOS transistors have 2~3 times the driving capability than that of the same size PMOS transistors, the sense amplifier 310 used in Vdd sensing scheme can be smaller in layout size than the sense amplifier 320 used in ground sensing scheme.

Figure 4:
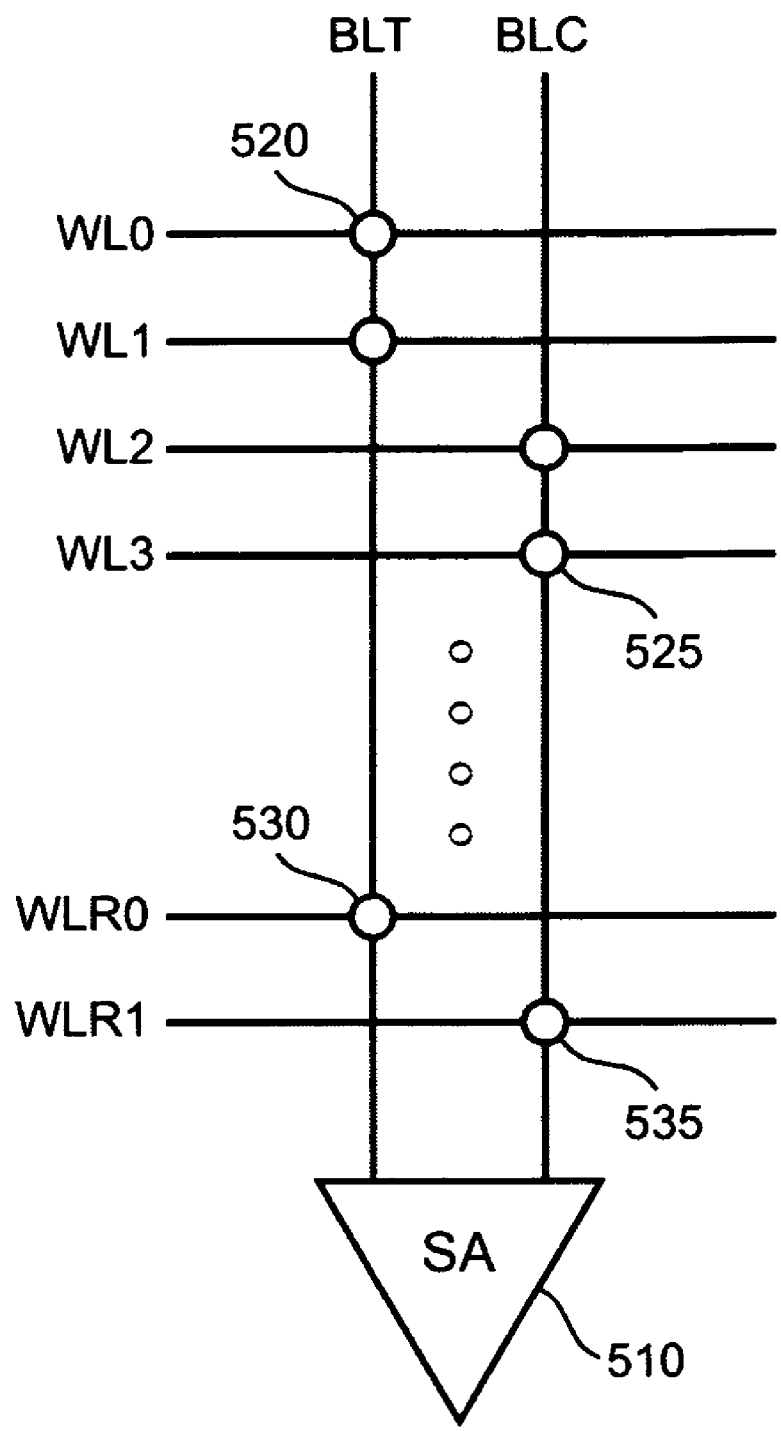
FIG. 4 is a schematic diagram illustrating an arrangement of a DRAM array according to an embodiment of the present invention.

FIG. 4 is a schematic diagram illustrating an arrangement of a DRAM array according to an embodiment of the present invention. A DRAM block have multiple word-lines, WL0, WL1, WL2, WL3, . . . , sharing multiple continuous bit-lines. There are also two reference word-lines, WLR0 and WLR1, on the bit-lines. Circles such as 520 and 525 represent regular DRAM cells, and circles 530 and 535 represents two reference cells. As an example, if a bit-line pair, BLT and BLC, is connected to a sense-amplifier 510. When the cell 520 on the bit-line, BLT, is read, the reference word-line, WLR1, for the reference cell 535 on the complementary bit-line, BLC, is activated, so that cells 520 and 535 are compared. Similarly, if normal cell 525 is to be read, the reference word-line, WLR0 will turn on the reference cell 530. There are always a normal cell and a reference cell on both side of the bit-line pair for differential sensing.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A dynamic random access memory (DRAM) device comprising:
   a first bit-line coupled to a first terminal of at least one memory cell capacitor through one or more pass transistors;
   a second bit-line coupled to a first terminal of at least one reference cell capacitor through one or more pass transistors; and
   a cell plate connected to both a second terminal of at least one memory cell capacitor and a second terminal of at least one reference cell capacitor,
   wherein the cell plate is biased at approximately one half of a voltage difference between a positive supply voltage (Vdd) and a complementary lower supply voltage (Vss), and
   wherein the reference cell capacitor does not store any charge prior to a reading operation, and both the first and second bit-lines are pre-charged to a power supply voltage prior to the reading operation.

2. The DRAM device of claim 1, wherein the power supply voltage is the Vdd.

3. The DRAM device of claim 2 further comprising a sense amplifier connected to both the first and second bit-lines, wherein a voltage difference between the first and second bit-lines is sensed and amplified.

4. The DRAM device of claim 3, wherein the sense amplifier comprises one or more N-type silicon-metal-semiconductor (NMOS) transistors for controlling an activation of the sense amplifier.

5. The DRAM device of claim 1, wherein the power supply voltage is the Vss.

6. The DRAM device of claim 5 further comprises a sense amplifier connected to both the first and second bit-lines, wherein a voltage difference between the first and second bit-lines is sensed and amplified.

7. The DRAM device of claim 6, wherein the sense amplifier comprises one or more P-type silicon-metal-semiconductor (PMOS) transistors for controlling an activation of the sense amplifier.

8. A dynamic random access memory (DRAM) device comprising:
   a first bit-line coupled to a first terminal of at least one memory cell capacitor through one or more pass transistors;
   a second bit-line coupled to a first terminal of at least one reference cell capacitor through one or more pass transistors; and
   a cell plate connected to both a second terminal of at least one memory cell capacitor and a second terminal of at least one reference cell capacitor,
   wherein the cell plate is biased at approximately one half of a voltage difference between a positive supply voltage (Vdd) and a complementary lower supply voltage (Vss), and
   wherein the reference cell capacitor does not store any charge prior to a reading operation, and
   wherein both the first and second bit-lines are pre-charged to the Vdd prior to the reading operation.

9. The DRAM device of claim 8 further comprising a sense amplifier connected to both the first and second bit-lines, wherein a voltage difference between the first and second bit-lines is sensed and amplified.

10. The DRAM device of claim 9, wherein the sense amplifier comprises one or more N-type silicon-metal-semiconductor (NMOS) transistors for controlling an activation of the sense amplifier.

11. A dynamic random access memory (DRAM) device comprising:
    a first bit-line coupled to a first terminal of at least one memory cell capacitor through one or more pass transistors;
    a second bit-line coupled to a first terminal of at least one reference cell capacitor through one or more pass transistors; and
    a cell plate connected to both a second terminal of at least one memory cell capacitor and a second terminal of at least one reference cell capacitor,
    wherein the cell plate is biased at approximately one half of a voltage difference between a positive supply voltage (Vdd) and a complementary lower supply voltage (Vss), and
    wherein the reference cell capacitor does not store any charge prior to a reading operation, and
    wherein both the first and second bit-lines are pre-charged to the Vss prior to the reading operation.

12. The DRAM device of claim 11 further comprising a sense amplifier connected to both the first and second bit-lines, wherein a voltage difference between the first and second bit-lines is sensed and amplified.

13. The DRAM device of claim 12, wherein the sense amplifier comprises one or more P-type silicon-metal-semiconductor (PMOS) transistors for controlling an activation of the sense amplifier.

14. A method for operating a dynamic random access memory (DRAM) device, the method comprising:
    providing a first bit-line coupled to a first terminal of at least one memory cell capacitor through one or more pass transistors;
    providing a second bit-line coupled to a first terminal of at least one reference cell capacitor through one or more pass transistors;
    biasing both a second terminal of at least one memory cell capacitor and a second terminal of at least one reference cell capacitor to approximately one half of a voltage difference between a positive supply voltage (Vdd) and a complementary lower supply voltage (Vss);
    pre-charging the reference cell capacitor to approximately a zero amount of charge prior to a reading operation; and
    pre-charging both the first and second bit-lines to the Vdd prior to the reading operation.

15. The method of claim 14 further comprising sensing and amplifying a voltage difference between the first and second bit-lines after the voltage difference passes a predetermined value.

16. A method for operating a dynamic random access memory (DRAM) device, the method comprising:

providing a first bit-line coupled to a first terminal of at least one memory cell capacitor through one or more pass transistors;

providing a second bit-line coupled to a second terminal of at least one reference cell capacitor through one or more pass transistors;

biasing both a second terminal of at least one memory cell capacitor and a second terminal of at least one reference cell capacitor to approximately one half of a voltage difference between a positive supply voltage (Vdd) and a complementary lower supply voltage (Vss);

pre-charging the reference cell capacitor to approximately a zero amount of charge prior to a reading operation; and pre-charging both the first and second bit-lines to the (Vss) prior to the reading operation.

17. The method of claim 16 further comprising sensing and amplifying a voltage difference between the first and second bit-lines after the voltage difference passes a predetermined value.

* * * * *